United States Patent [19]

Ching

[11] 4,025,852
[45] May 24, 1977

[54] METHOD AND ARRANGEMENT FOR CONTROLLING DELTA MODULATOR IDLE-CHANNEL NOISE

[75] Inventor: Yau-Chau Ching, Morganville, N.J.

[73] Assignee: Bell Telephone Laboratories, Incorporated, Murray Hill, N.J.

[22] Filed: Oct. 14, 1975

[21] Appl. No.: 622,084

[52] U.S. Cl. .............................. 325/38 B; 332/11 D
[51] Int. Cl.² .................... H04B 15/00; H03K 7/00
[58] Field of Search ................ 325/38 R, 38 B, 41, 325/42, 65; 328/165; 332/110; 340/347 A, 347 D

[56] References Cited
UNITED STATES PATENTS

| | | | |
|---|---|---|---|
| 3,706,944 | 12/1972 | Tewksbury | 325/38 B X |
| 3,815,033 | 6/1974 | Tewksbury | 325/38 B X |
| 3,855,555 | 12/1974 | Burkhard et al. | 325/42 X |
| 3,857,111 | 12/1974 | Deschenes et al. | 325/38 B X |
| 3,882,484 | 5/1975 | Brokaw et al. | 325/38 B X |
| 3,899,754 | 8/1975 | Brolin | 325/38 B X |

Primary Examiner—Robert L. Griffin
Assistant Examiner—Aristotelis M. Psitos
Attorney, Agent, or Firm—Ronald D. Slusky

[57] ABSTRACT

The idle-channel noise of a delta modulator is controlled by controlling the relative step size imbalance, $\theta$. The instantaneous magnitude of the delta modulator output signal is converted to a multibit word and a second multibit word, representing a predetermined number, N, is subtracted therefrom. The dc component of the difference word is converted to analog form, amplified and inverted, and fed back to the delta modulator input stage. As a result, $\theta \approx -N$. The delta modulated signal may be converted to a pulse-code modulated (PCM) signal using a digital integrator having a leak, $\beta$, in which case $\theta \approx -\beta N$. At the same time, the dc component of the PCM signal is advantageously reduced substantially to zero.

15 Claims, 11 Drawing Figures

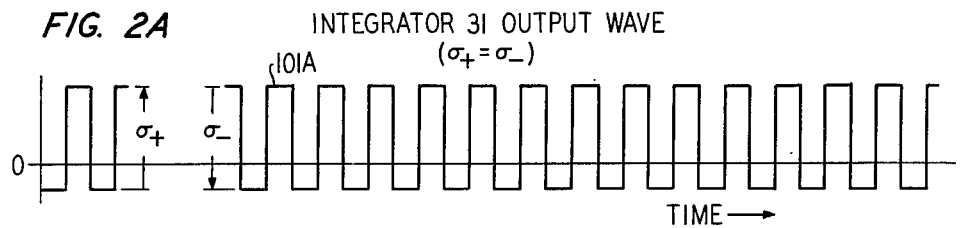
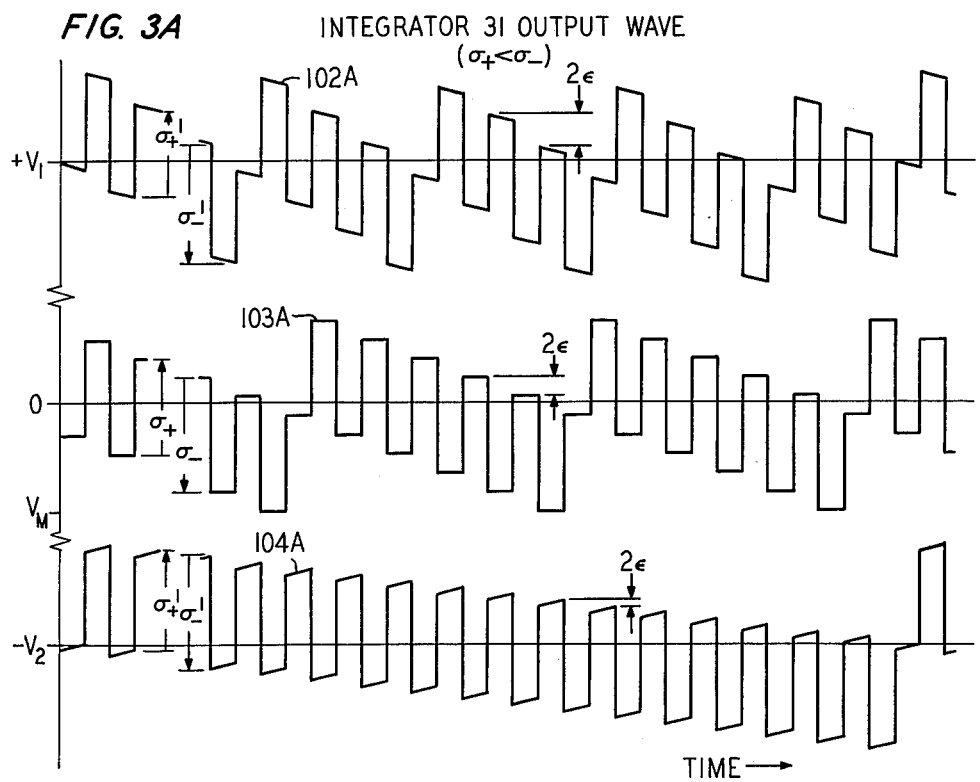
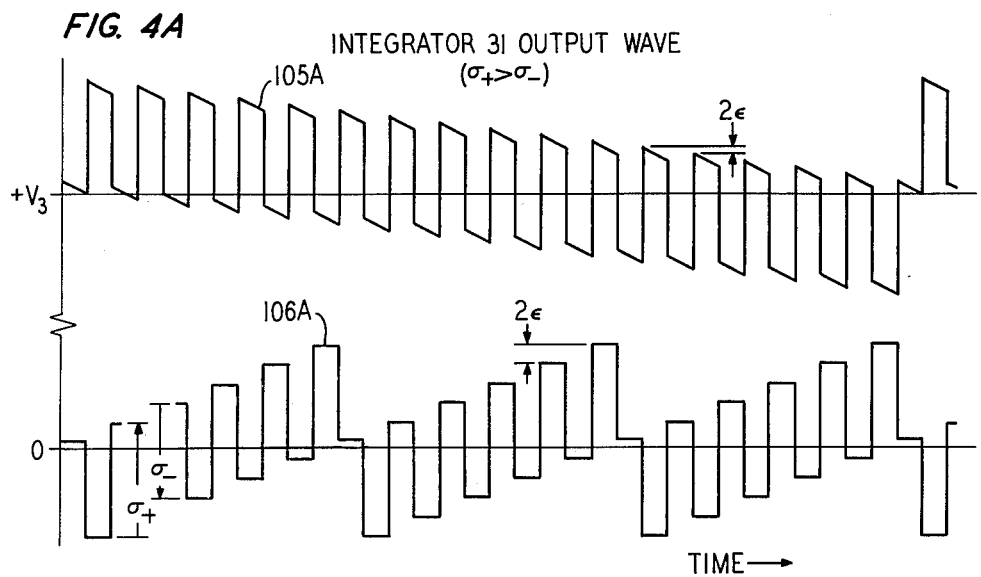

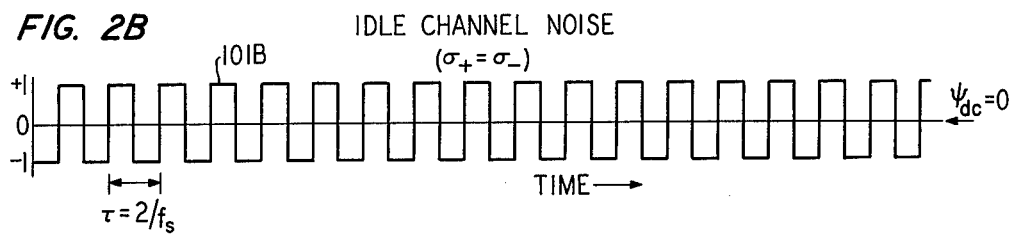
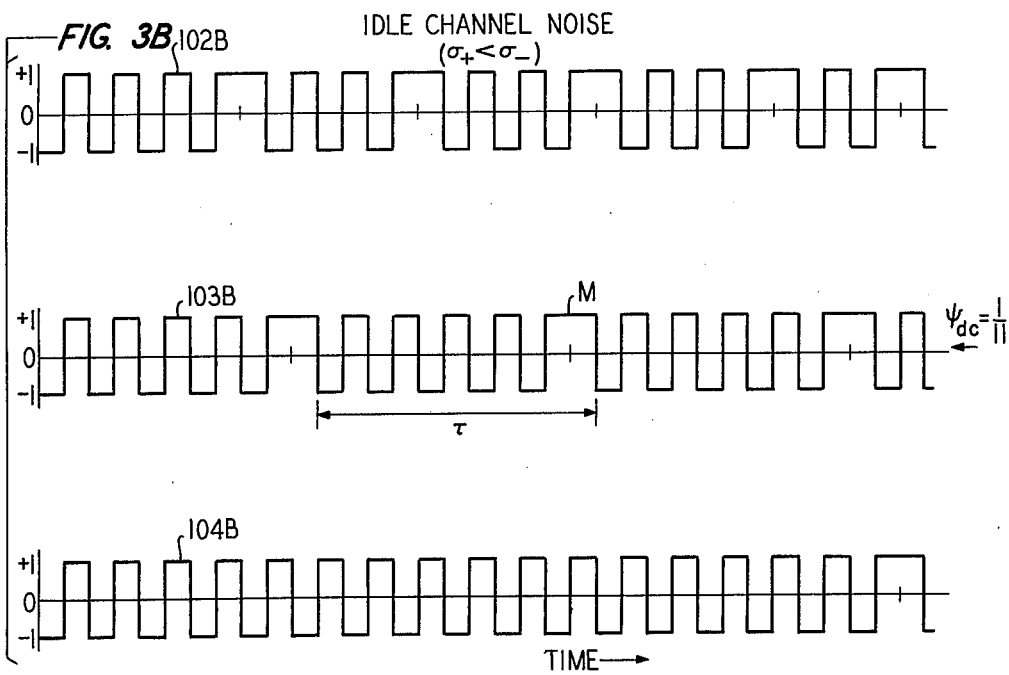
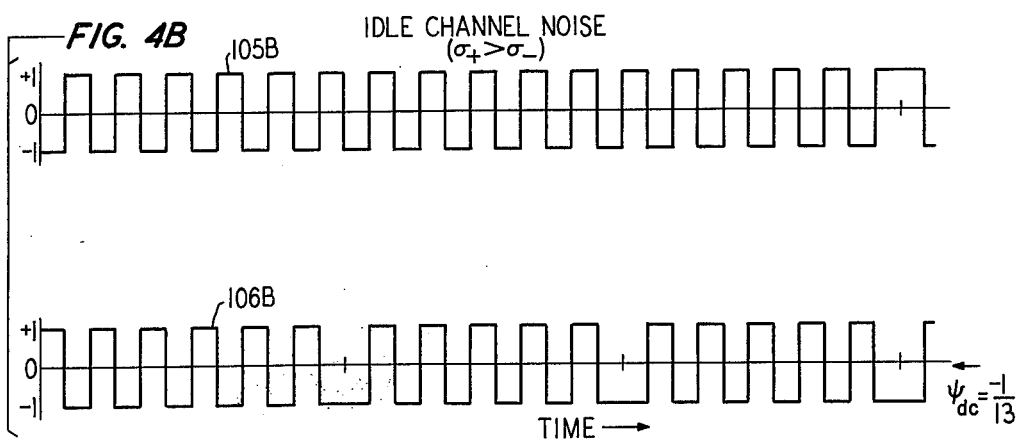

METHOD AND ARRANGEMENT FOR CONTROLLING DELTA MODULATOR IDLE-CHANNEL NOISE

BACKGROUND OF THE INVENTION

In a delta modulator, a baseband input signal to be coded is periodically compared to the output of an integrator at a sampling frequency $f_s$. If the input signal is larger than the integrator signal at any given sampling time, the modulator generates an output +1. At the same time, a positive step of amplitude $\sigma_+$ is applied to the integrator, thereby increasing its output signal for the next comparison. If, on the other hand, the input signal is smaller than the integrator signal at a particular sampling time, the modulator generates an output −1 and a negative step of amplitude $\sigma_-$ is applied to the integrator.

An output wave, called the "idle-channel noise", is generated by a delta modulator even when its input signal is quiescent. The frequency spectrum of the idle-channel noise comprises an infinite series of components, the frequency domain locations of which are dependent on $f_s$ and a quantity referred to as the relative step size imbalance, $\theta$. The total inband idle-channel noise power is minimized when the idle-channel noise fundamental frequency, $\theta f_s$, is located just outside the input signal baseband, Heretofore, however, it has been found difficult to control the value of $\theta$.

A further problem arises in pulse code modulators wherein the pulse-code modulated (PCM) signal is generated by integrating the delta-modulated signal using a digital integrator. In such PCM modulators, amplitude overload in the PCM signal, which would otherwise result from the fact that $\theta$ cannot as a practical matter be reduced to zero, is overcome by introducing a predetermined (and precisely controllable) leak, $\beta$, into the delta-modulation-to-PCM converter. However, the resultant PCM signal includes a substantial dc component which, disadvantageously, reduces the effective PCM quantization range.

SUMMARY OF THE INVENTION

Accordingly, an object of the present invention is to provide a method and arrangement for precisely controlling the frequency spectrum of the idle-channel noise in delta modulators and in pulse-code modulators which include delta modulators.

Another object of the invention is to provide a method and arrangement for minimizing the dc component of PCM signals generated from delta-modulated signals in the manner described above.

These and other objects are achieved in accordance with the invention by introducing a dc offset signal at the modulator input. The magnitude of the offset signal is an amplified version of the difference between the dc component of the delta- or pulse-code-modulated signal, as the case may be, and a selected number N. The sign, or polarity, of the offset signal is negative when the dc component of the modulated signal is greater than N and positive when the opposite relationship obtains. As a result, $\theta \approx -N$ in the delta modulator and thus $\theta$ can be precisely controlled. In the pulse-code modulator, $\theta \approx -\beta N$ and thus again, $\theta$ can be precisely controlled. At the same time, the dc component of the PCM signal is reduced substantially to zero.

BRIEF DESCRIPTION OF THE DRAWING

The invention may be clearly understood from a consideration of the following detailed description and accompanying drawing in which:

FIGS. 2A, 3A and 4A show output waveforms of an integrator used in the delta modulator of FIG. 1;

FIGS. 2B, 3B and 4B show idle-channel noise waveforms generated by the delta modulator of FIG. 1 in response to the integrator output waves of FIGS. 2A, 3A and 4A, respectively;

DETAILED DESCRIPTION

Figure 1:
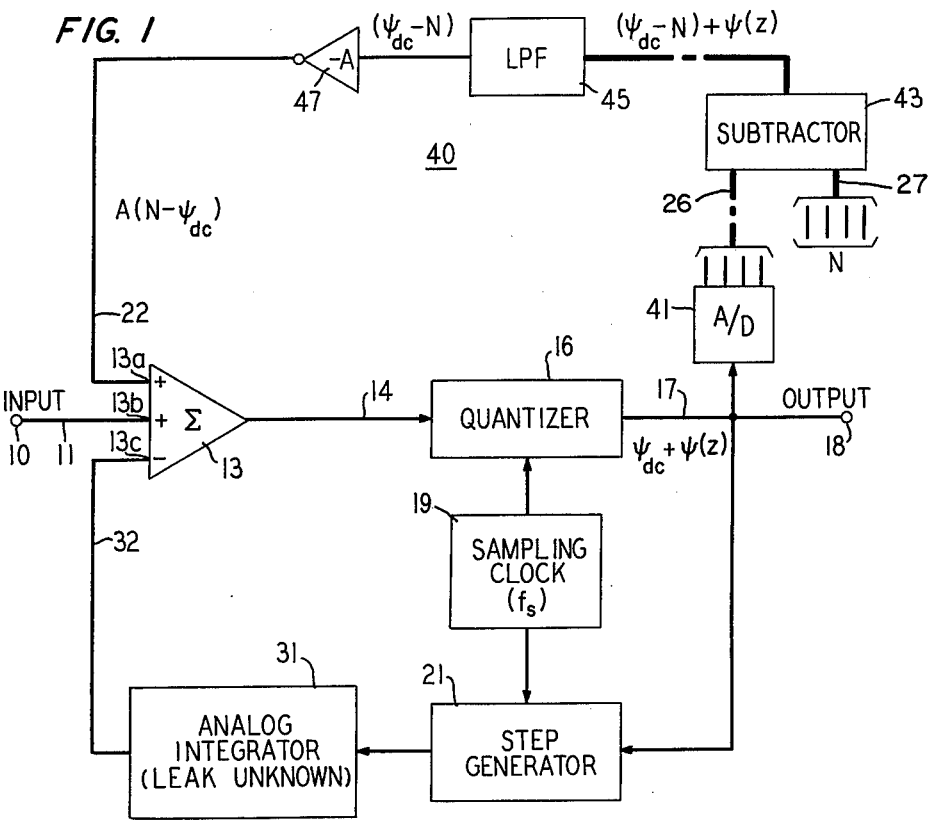
FIG. 1 is a block diagram of a delta modulator which includes feedback circuitry embodying the principles of the present invention.

The delta modulator of FIG. 1 includes summer 13 which has positive input terminals 13a and 13b and negative input terminal 13c. An input signal, or wave, is received at terminal 13b from input terminal 10 via lead 11. A delta-modulated version thereof is provided at output terminal 18.

More particularly, the output wave of analog integrator 31 is received at terminal 13c from lead 32. It may be assumed for the present that the signal at terminal 13a is at ground potential, i.e. zero volts. The "composite" output signal of summer 13 on lead 14 thus represents the signed amplitude difference between the signals on leads 11 and 32. This difference signal is extended to quantizer 16. The latter receives a sequence of regularly-spaced sampling pulses from sampling clock 19 at a sampling frequency $f_s$. Quantizer 16 extends an output pulse to output terminal 18 via lead 17 in response to each sampling pulse — −1 if the difference signal on lead 14 is negative, and +1 if positive.

The sampling pulses from clock 19 are also extended to step generator 21. If the signal on lead 17 is +1 (or, alternatively, −1), when a particular clock pulse is received by generator 21, that unit extends a positive (negative) step of magnitude $\sigma_+$ ($\sigma_-$) to integrator 31, thereby increasing (decreasing) the signal on lead 32 prior to the next sampling pulse.

Assume that the input signal at terminal 10 is quiescent at ground potential. Assume further, as shown in FIG. 2A, that the integrator 31 output wave, indicated at 101A, is initially less than zero. The composite signal on lead 14 is positive. The next clock pulse causes a +1 to be generated on lead 17. Generator 21 applies a positive step, $\sigma_+$, to integrator 31, increasing wave 101A to a positive value. The composite signal on lead 14 is now negative. The next clock pulse causes a −1 to be generated on lead 17 and generator 21 applies a negative step, $\sigma_-$, to integrator 31. As shown in FIG. 2A, $\sigma_+$ is ideally equal to $\sigma_-$, so that wave 101A is returned to its initial value.

The signal generated on lead 17, and hence at output terminal 18, in response to the integrator 31 output wave is referred to as the "idle-channel noise". As indicated in FIG. 2B, the particular idle-channel noise wave 101B generated in response to integrator output wave 101A is a square wave of period $\tau = 2/f_s$. Typically, its fundamental frequency $f_s/2$ is many times greater than the highest input wave frequency. Ideally, then, no components of the idle-channel noise should fall within the input baseband.

In practice, however, it is extremely difficult to equalize the positive and negative step sizes, at least when the delta modulator includes an analog, rather than a digital integrator. Wave 103A in FIG. 3A represents the integrator 31 output wave generated when $\sigma_+ < \sigma_-$. The quantity $(\sigma_+ - \sigma_-)$ is referred to herein as the "step generator imbalance." Again, the signals at terminals 13a and 13b are assumed to be at ground potential. Wave 103A changes by an amount $2\epsilon = (\sigma_+ - \sigma_-)$ for each square-wave cycle, i.e. for each $\tau = 2/f_s$ seconds. Since $\sigma_+ < \sigma_-$, then $2\epsilon < 0$. At periodic intervals, wave 103A becomes so negative (e.g. level $V_M$) that a single positive step is insufficient to bring it above ground, causing step generator 21 to extend a second positive step to integrator 31. The idle-channel noise wave generated in response to integrator wave 103A is indicated as wave 103B in FIG. 3B. The periodic double positive step in integrator wave 103A causes a periodic double +1 (such as at point M) in idle-channel noise wave 103B. As indicated in FIG. 3B, the fundamental period $\tau$ of the idle-channel noise is now the interval between successive double +1s.

Figure 5A:
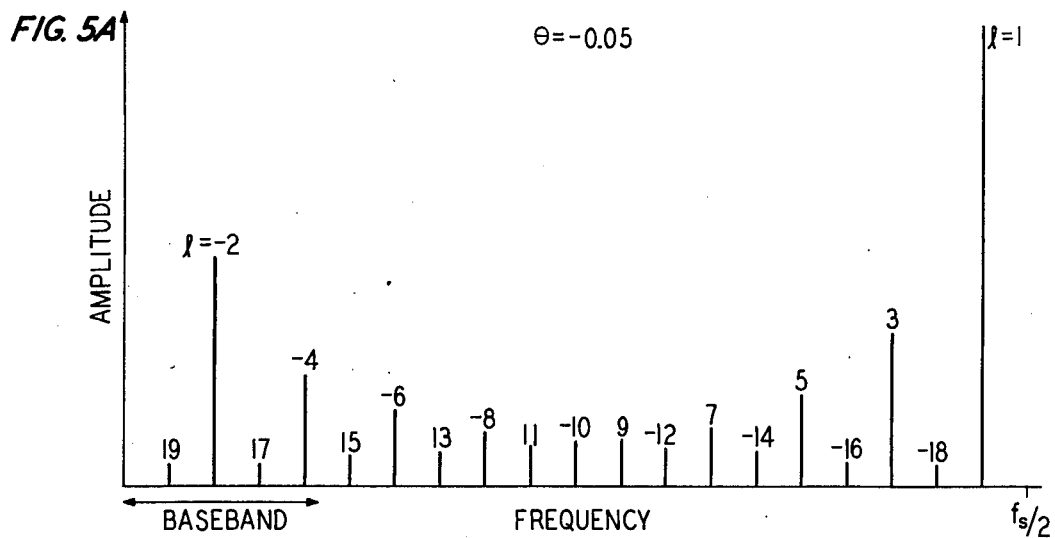
FIGS. 5A, 5B and 5C show frequency spectra of idle-channel noise waveforms for varying values of relative step-size imbalance, $\theta$.
Figure 5B:
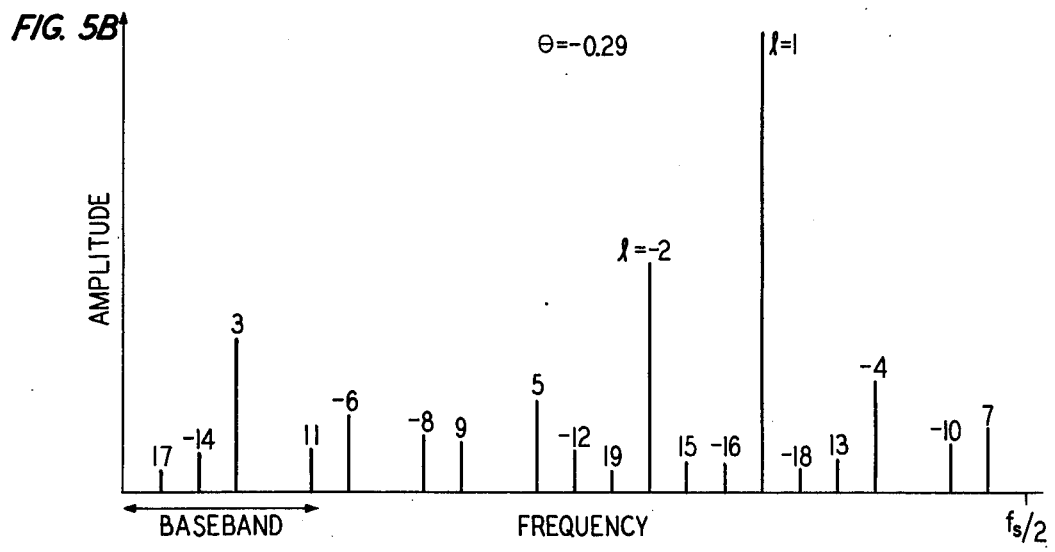
Figure 5C:
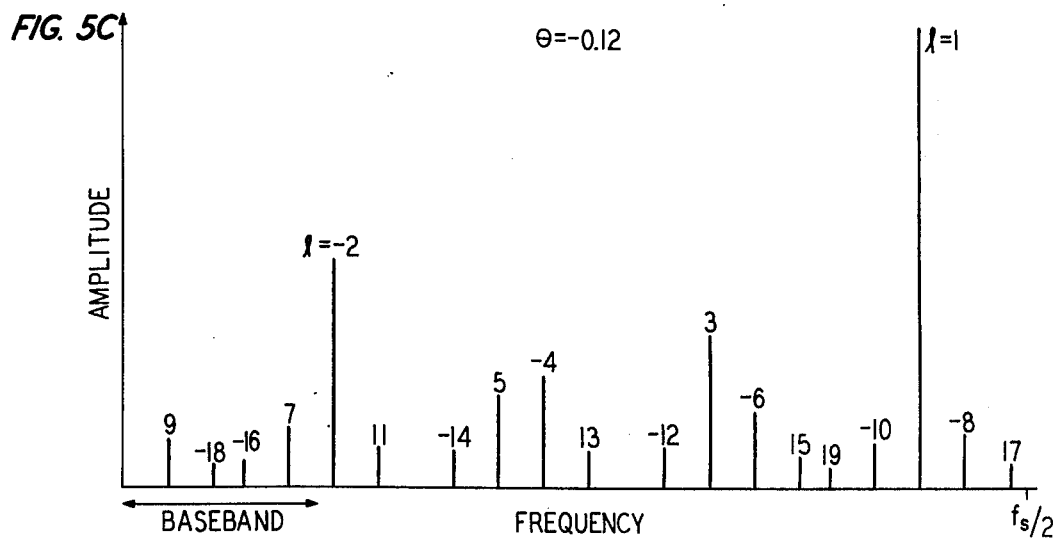

As discussed, for example, by J. E. Iwersen in 48 Bell System Technical Journal 2359 (Sept. 1969), the frequency spectrum of an idle-channel noise wave such as wave 103B comprises an infinite series of components located at $$\left[\frac{l(1-\theta)}{2} + k\right]f_s$$

where $l$ and $k$ are any integers and $\theta$ is the relative step size imbalance defined as $$\theta \equiv \frac{\epsilon}{(\sigma_+ + \sigma_-)/2},$$

and where amplitude of a particular idle-channel noise component is inversely proportional to $|l|$. For each value of $l$, there is only one value of $k$ which leads to a component within the interval of practical interest, i.e. the Nyquist interval $[-f_s/2, f_s/2]$. FIG. 5A shows a typical one-sided idle-channel noise spectrum within the positive region of the Nyquist interval $[0, f_s/2]$ for $l = 1$, $-2, 3, -4, \ldots 19$. Here, $\theta = -0.05$. Note that the relatively strong, $l = -2$ and $-4$ components fall within the input baseband. The result is an annoying tone in the modulated signal. These particular two components can be shifted out of the baseband by increasing the magnitude of $\theta$. In FIG. 5B, for example, $\theta = -0.29$. FIG. 5B also shows, however, that with $\theta = -0.29$ other components, notably the $l = 3$ component, are brought into the baseband. It turns out that the total inband noise power is minimized when the $l = -2$ component, which has a frequency $|\theta f_s|$, is located just above the baseband, as shown in FIG. 5C. In the present example, this is accomplished when $\theta = -0.12$. However, precise control of $\sigma_+$ and $\sigma_-$, thus of $\theta$, and thus of the idle-channel noise component locations have heretofore been found difficult to achieve in practice.

The present invention is directed to a novel method and arrangement for achieving such control. An analog integrator, such as integrator 31 in FIG. 1, typically employs a capacitor or other storage device to hold the voltage representing the integrated signal. Thus in a realistic delta modulator, unavoidable leak in the integrator causes the stored signal to decay, albeit by a small amount, between successive sampling pulses. This has the same effect on the idle-channel noise waveform as would changing the positive and negative step sizes by the amount of the leak. Thus for a realistic delta modulator, $\theta$ is better defined as $$\theta \equiv \frac{\epsilon}{(\sigma_+' + \sigma_-')/2}$$

where $\sigma_+'$ and $\sigma_-'$ are the effective positive and negative step sizes, respectively, (i.e., taking integrator leak into account) and $\epsilon = (\sigma_+' - \sigma_-')/2$. More particularly, the effective positive (or negative) step size is the net amount by which the integrator 31 output wave increases (decreases) from a time just prior to a positive (negative) step therein to a time just prior to the subsequent positive or negative step. Wave 103A represents the ideal, no-leak case so that for this wave, $\sigma_+' = \sigma_+$ and $\sigma_-' = \sigma_-$.

In accordance with the invention, the amount of integrator leak, thus the values of $\sigma_+'$ and $\sigma_-'$, and thus the value of $\theta$ are varied by adding a dc offset signal at the delta modulator input stage. This is illustratively achieved in FIG. 1 by providing a dc offset voltage on lead 22 so as to vary the composite signal on lead 14. As indicated in FIG. 3A, the resultant integrator output wave 102A now oscillates about the offset voltage, which is illustratively $+V_1$. Here, $\sigma_+' < \sigma_+$ and $\sigma_-' > \sigma_-$, and downward decay of wave 102A toward ground between successive sampling pulses tends to reinforce the downward step generator imbalance. The magnitude of $2\epsilon$ is increased, while $(\sigma_+' + \sigma_-') \approx (\sigma_+ + \sigma_-)$. Hence, the magnitude of $\theta$ is increased. The corresponding idle-channel noise waveform is indicated at 102B in FIG. 3B.

If, on the other hand, lead 22 carries a negative offset voltage, $-V_2$, then $\sigma_+' > \sigma_+$ and $\sigma_-' < \sigma_-$. The integrator 31 output wave, indicated at 104A in FIG. 3A, decays upward. This upward decay tends to oppose the downward step generator imbalance. As a result, the magnitude of $2\epsilon$ is decreased. Hence the magnitude of $\theta$ is decreased. The corresponding idle-channel noise waveform is indicated at 104B in FIG. 3B.

As thus far described, the above technique for increasing or decreasing the magnitude of $\theta$ may be found useful where the step generator imbalance, $(\sigma_+ - \sigma_-)$, and integrator 31 leak factor (i.e., the voltage leak per volt stored) are at least approximately known. An appropriate offset signal value to provide the desired $\theta$ could then be determined. Unfortunately, the step generator imbalance and integrator leak are not usually known with sufficient precision to do this.

In accordance with an important feature of the invention, however, precise control of $\theta$ is achieved in the delta modulator of FIG. 1, for example, by generating the dc offset voltage on lead 22 via a feedback loop indicated generally at 40. The magnitude of the offset voltage generated by loop 40 is an amplified version of the difference between the dc component of the delta-modulated signal on lead 17 and a selected number. The sign, or polarity, of the offset signal is negative when the dc component of the modulated signal is greater than the selected number, and positive when the opposite relationship obtains.

More particularly, A/D converter 41 of loop 40 derives from the instantaneous value of the modulated signal on lead 17 a first multibit word representing that value. The multibit word is received by subtractor 43 on subtractor input cable 26. A second multibit word representing a predetermined quantity, or number, N, is received on input cable 27 of subtractor 43, which subtracts it from the converter 41 output word. The signal on lead 17 has a dc component $\psi_{dc}$ and nonzero-frequency components $\psi(z)$. Thus, the difference word at the output of subtractor 43 represents a signal $(\psi_{dc}-N) + \psi(z)$. Low-pass filter 45 filters out all but the dc component of the difference word, $(\psi_{dc}-N)$, and converts it to analog form. Amplifier 47, which has a gain $-A$, $(|A|>1)$ amplifies and inverts the output signal of filter 45 and extends an offset signal of value $A(N-\psi_{dc})$ to input terminal 13a via lead 22. Of course, it will be appreciated that the specific circuitry shown for loop 40 is merely illustrative. Numerous other arrangements will occur to those skilled in the art for providing the offset signal $A(N-\psi_{dc})$ on lead 22.

As will now be shown, feedback loop 40 causes $\psi_{dc}$ to be substantially equal to N. It will also be shown that $\psi_{dc} = -\theta$. Thus $\theta \approx -N$, independent of the step size imbalance in step generator 21 and independent of the magnitude of the integrator 31 leak factor. Since N is a digital quantity and can be precisely set, $\theta$ can also be precisely set and the desired end result is achieved.

Assume, for example, that $\sigma_+ < \sigma_-$ and that without loop 40 in operation, the output wave of integrator 31 is similar to wave 103A. The resultant idle-channel noise wave 103B contains a periodic double +1. Its dc component, $\psi_{dc}$, is +1/11 since wave 103B contains six +1s for every five −1s. Asume further that $\sigma_{dc}$ is greater than N. With loop 40 in operation, inverting amplifier 47 generates a large negative voltage, $-V_2 = -|A(N-\psi_{dc})|$, on lead 22. As illustrated by wave 104A, the integrator 31 output wave now oscillates about this negative voltage. This decreases the frequency with which double +1s occurs in the idle-channel noise wave 104B. Hence, the magnitude of $\psi_{dc}$ decreases toward N. Of course, this causes the magnitude of the offset signal on lead 22 to decrease, and $\psi_{dc}$ stabilizes at a value somewhat greater than N. By making the gain of amplifier 47 sufficiently large, however, the difference between $\psi_{dc}$ and N can be made very small.

If, on the other hand, $\psi_{dc}$ is less than N, lead 22 carries a large positive voltage $+V_1 = +|A(N-\psi_{dc})|$. As illustrated by wave 102A, the integrator 31 output wave now oscillates about $+V_1$. This increases the frequency with which double +1s occur in idle-channel noise wave 102B. Hence $\psi_{dc}$ increases toward N. Again, a large value of gain for amplifier 47 ensures that the difference between $\psi_{dc}$ and N is very small.

Alternatively, it may turn out that $\sigma_+$ is greater than $\sigma_-$ so that the integrator 31 output wave generated with no offset signal on lead 22 is similar to wave 106A in FIG. 4A. The resultant idle-channel noise wave 106B in FIG. 4B contains periodic double −1s. Its dc component, $\psi_{dc}$, is illustratively −1/13. Again, $\psi_{dc} < N$, and with feedback loop 40 in operation, lead 22 carries a very large positive signal $+V_3$. The gain of amplifier 47 is made sufficiently large for the anticipated step generator imbalance that, as indicated by wave 105A, the downward decay caused by the leak in integrator 31 overcomes the upward step generator imbalance. The resultant idle-channel noise wave 105B again contains periodic double +1s and, again, $\psi_{dc} \approx N$.

Now it may be seen from FIG. 3A that the maximum amplitude of output waves 102A and 104A, for example, is approximately equal to $\sigma_+'$. Thus the fundamental period of these waves (i.e., the interval between successive double positive steps) includes, on average, $$\left(\frac{\sigma_+'}{-2\epsilon} + 1\right)$$

positive steps and $$\left(\frac{\sigma_+'}{-2\epsilon}\right)$$

negative steps. Thus $$\psi_{dc} = \frac{[+1]\left[\frac{\sigma_+'}{-2\epsilon} + 1\right] + [-1]\left[\frac{\sigma_+'}{-2\epsilon}\right]}{\left[\frac{\sigma_+'}{-2\epsilon} + 1\right] + \left[\frac{\sigma_+'}{-2\epsilon}\right]} = \frac{\epsilon}{\sigma_+' - \epsilon}.$$

But $\epsilon = (\sigma_+' - \sigma_-')/2$ so that $$\psi_{dc} = \frac{-\epsilon}{(\sigma_+' + \sigma_-')/2} = -\theta,$$

and since $\psi_{dc} \approx N$, then $\theta \approx -N$. Advantageously, then, $\theta$ may be set to any desired value by choosing the appropriate value for N.

In addition to providing a mechanism for controlling delta modulator idle-channel noise, the present invention also advantageously provides a mechanism for minimizing the dc offset which results when a delta-modulated signal is converted to a pulse-code-modulated (PCM) signal. This conversion is frequently effected in the art by integrating the delta-modulated signal using, for example, a digital integrator. However, the unavoidable nonzero $\theta$ results in amplitude overload in the PCM signal. This overload is typically overcome by introducing a predetermined (and precisely controllable) amount of leak into the digital integrator. However, the resultant PCM signal includes a substantial nonzero dc component, disadvantageously reducing the quantization range of the PCM signal. Since the magnitude of this dc component is a function of $\theta$, it has been found difficult to control heretofore.

Advantageously, the dc component of the PCM signal is reduced substantially to zero in accordance with the invention by utilizing the feedback circuitry disclosed herein. Particular reference may be made to the PCM modulator, or encoder, of FIG. 6, which includes delta-modulation circuitry similar to that in FIG. 1. Reference numerals for circuit elements in FIG. 6 begin with the digit 2 but have the same second and third digits as the corresponding elements in FIG. 1.

Figure 6:
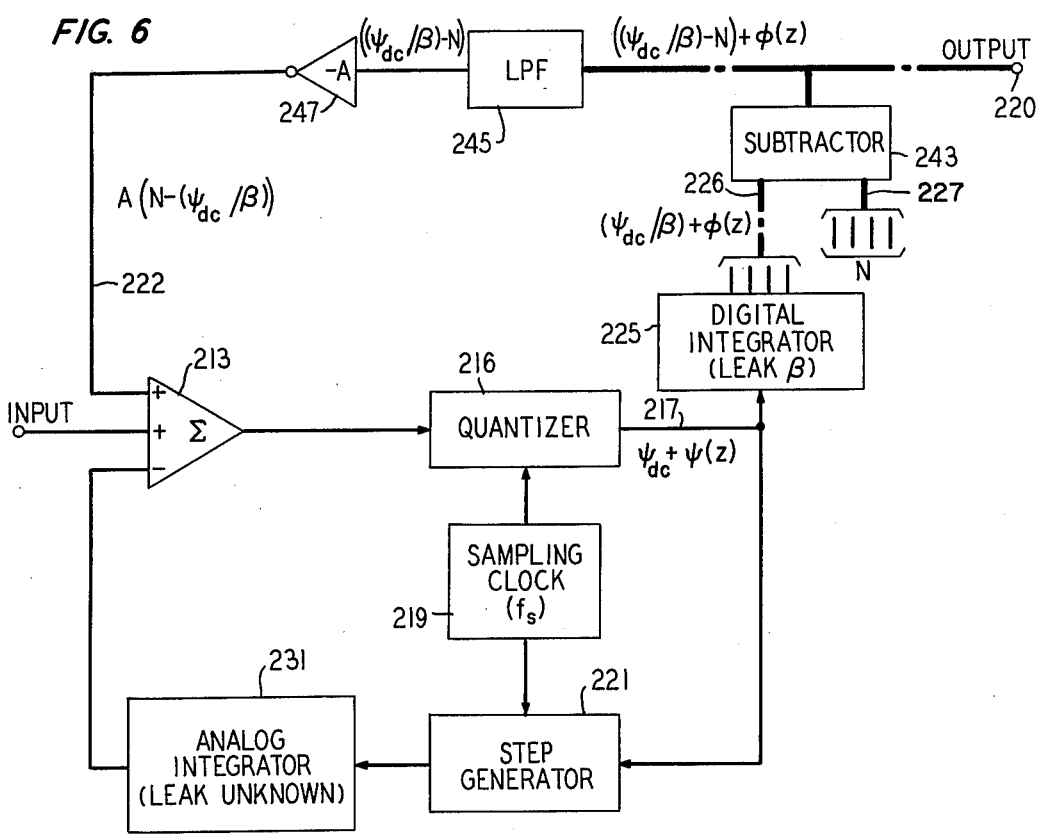
FIG. 6 shows a block diagram of a pulse code modulator which includes feedback circuity embodying the principles of the present invention.

The modulator of FIG. 6 additionally includes digital integrator 225, which performs the delta modulation-to-PCM conversion. Integrator 225 receives the delta-modulated signal $\psi_{dc} + \psi(z)$ on lead 217 and derives therefrom a running total of the +1s and −1s appearing on that lead. The instantaneous value of this running total is provided in the form of a first digital PCM word on cable 226. Integrator 225 has an associated leak, $\beta$, whereby the magnitude of its PCM output word is multiplied by $(1 - \beta) < 1$ between each successive pulse received from lead 217. Since $\psi_{dc} \neq 0$, the magnitude of the integrator 225 output word continually increases until such time as the magnitude of the decay between successive received pulses equals the full magnitude of a delta-modulated pulse, i.e., 1. The dc value of the PCM word on cable 226 is then stable at $(\psi_{dc}/\beta)$. The nonzero-frequency components, $\phi(z)$, of the PCM word on cable 226, represent an integrated version of $\psi(z)$ taking the leak of integrator 225 into account.

In accordance with the invention, subtractor 243 subtracts N, which is received on cable 227, from the PCM word on cable 226. The dc component thereof, $[(\psi_{dc}/\beta)-N]$, is extracted and converted th analog form by low-pass filter 245. It is then amplified and inverted by amplifier 247 and extended to summer 213 via lead 222. $/\beta-$ The dc component at the output subtractor 243 is $[(\psi_{dc}/\beta)-N]$. By making the gain of amplifier 247 sufficiently large, the feedback mechanism discussed above results in $(\psi_{dc}/\beta) \approx N$. Since $\psi_{dc} = -\theta$, then $\theta = -\beta N$, and, as before, $\theta$ can be precisely controlled. At the same time, $[(\psi_{dc}-N] \approx 0$. Thus, the dc component of the word at the output of subtractor 243, which is extended to terminal 220 as the PCM output word, is substantially zero, as desired.

Although specific embodiments have been shown and described herein, these merely illustrate the principles of the present invention. Many and varied arrangements embodying those principles may be devised by those skilled in the art without departing from the spirit and scope of the invention.

What is claimed is:

1. In combination,
    means responsive to an input signal for generating a composite signal,
    delta modulator means responsive to said composite signal for generating a delta-modulated signal,
    means for deriving a first signal from said delta-modulated signal,
    means for receiving a second signal representing a predetermined quantity, and
    means for generating an offset signal including means for forming a difference signal indicative of the difference between said first and second signals and for amplifying the dc component of said difference signal, said composite signal generating means including means for varying said composite signal in response to said offset signal.

2. The invention of claim 1 wherein said varying means comprises means for decreasing said composite signal by the magnitude of said offset signal when the dc component of said first signal is greater than said predetermined quantity and for increasing said composite signal by the magnitude of said offset signal when the opposite relationship obtains,
    wherein said delta modulator means includes means operative at repeated intervals for generating a first indication if the polarity of said composite signal is negative and a second indication if it is positive,
    and wherein said composite signal generating means further includes means for increasing said composite signal by a predetermined amount in response to each said first indication and for decreasing said composite signal by said predetermined amount in response to each said second indication.

3. The invention of claim 2 wherein said deriving means includes means for representing the instantaneous value of said first signal in the form of a first digital word, wherein said predetermined quantity is represented by a second digital word, and wherein said forming and amplifying means includes means for subtracting one of said digital words from the other to form a difference word and means for amplifying the dc component of said difference word and for converting it to analog form.

4. The invention of claim 3 wherein said deriving means further includes means for integrating said delta-modulated signal to generate said first signal, said integrating means having a predetermined leak.

5. In combination,
    means for receiving an input signal,
    means for generating a feedback signal,
    means for generating an offset signal,
    means operative at each of a plurality of successive sampling times for providing a first indication at a first level if the sum of said input and offset signals is greater than said feedback signal and for providing a second indication at a second level if said sum is less than said feedback signal, said feedback signal generating means including means for increasing said feedback signal by a predetermined amount for each said first indication and for decreasing said feedback signal by said predetermined amount for each said second indication, and
    means for deriving a signal from said first and second indications,
    said offset signal generating means including circuit means for providing said offset signal with a magnitude proportional to the difference between the dc component of said derived signal and a predetermined quantity,
    said deriving means including means for forming a first digital word indicative of the instantaneous value of said derived signal, and said circuit means including means for receiving said first word, means for receiving a second digital word indicative of said predetermined quantity, and means for generating an amplified analog representation of the dc component of the difference between said first and second digital words, said representation having a negative polarity when the dc component of said derived signal is greater than said predetermined quantity and a positive polarity when it is less than said predetermined quantity.

6. The invention of claim 5 wherein said deriving means further includes means for digitally integrating said first and second indications, said integrating means having a predetermined leak, $\beta$, such that the value of the integrated signal just prior to one of said sampling times is $(1-\beta)$ times its value just after the previous sampling time.

7. In combination, means for generating an offset signal, and means including a delta modulator and operative in response to an input signal and said offset signal for generating a modulated signal having a dc component $\psi_{dc}/\beta$, said offset signal generating mens including means for providing said offset signal with a value $A|N-(\psi_{dc}/\beta)|$, where $N$ is a predetermined number and $A$ is a predetermined numer greater than unity.

8. The invention of claim 7 wherein said providing means includes means for representing the instantaneous value of said modulated signal in the form of a first digital word, means for receiving a second digital word representing said number N, means for subtracting one of said digital words from the other to form a difference word, and means for amplifying the dc component of said difference word.

9. The invention of claim 8 wherein said delta modulator is operative in response to said input and offset signals for generating a delta-modulated signal having a dc component $\psi_{dc}$ and wherein said modulated signal generating means further includes means for digitally integrating said delta-modulated signal, said integrating means having a predetermined leak $\beta$.

10. A modulation method comprising the steps of,
generating a composite signal in response to an input signal,
generating a delta-modulated signal in response to said composite signal,
deriving a first signal from said delta-modulated signal,
receiving a second signal representing a predetermined quantity, and
generating an offset signal,
said offset signal generating step including the steps of forming a difference signal indicative of the difference between said first and second signals and amplifying the dc component of said difference signal, and said composite signal generating step including the step of varying said composite signal in response to said offset signal.

11. The invention of claim 10 wherein said varying step comprises the steps of decreasing said composite signal by the magnitude of said offset signal when the dc component of said first signal is greater than said predetermined quantity and increasing said composite signal by the magnitude of said offset signal when the opposite relationship obtains,
wherein said delta-modulated signal generating step includes the step of generating at repeated intervals a first indication if the polarity of said composite signal is negative and a second indication if it is positive,
and wherein said composite signal generating step includes the further steps of increasing said composite signal by a predetermined amount in response to each said first indication and decreasing said composite signal by said predetermined amount in response to each said second indication.

12. The invention of claim 11 wherein said deriving step includes the step of representing the instantaneous value of said first signal in the form of a first digital word, wherein said predetermined quantity is represented by a second digital word, wherein said forming step comprises the step of subtracting one of said digital words from the other to form a difference word, and wherein said amplifying step comprises the step of amplifying the dc component of said difference word, and converting it to analog form.

13. The invention of claim 12 wherein said deriving step includes the further step of integrating said delta-modulated signal to generate said first signal.

14. A modulation method comprising the steps of
receiving an input signal,
generating a feedback signal,
generating an offset signal,
providing at each of a plurality of successive sampling times a first indication at a first level if the sum of said input and offset signals is greater than said feedback signal and a second indication at a second level if said sum is less than said feedback signal, said feedback signal generating step including the steps of increasing said feedback signal by a predetermined amount for each said first indication and decreasing said feedback signal by said predetermined amount for each said second indication, and
deriving a signal from said first and second indications,
said offset signal generating step including the step of providing said offset signal with a magnitude proportional to the difference between the dc component of said derived signal and a predetermined quantity,
said deriving step including the step of forming a first digital word indicative of the instantaneous value of said derived signal, and said offset signal providing step including the steps of receiving a second digital word indicative of said predetermined quantity and generating an amplified analog representation of the dc component of the difference between said first and second digital words, said representation having a negative polarity when the dc component of said derived signal is greater than said predetermined quantity and a positive polarity when it is less than said predetermined quantity.

15. The invention of claim 14 wherein said deriving step includes the further step of digitally integrating said first and second signal indications with a leak, $\beta$, such that the value of the integrated signal just prior to one of said sampling times is $(1-\beta)$ times its value just after the previous sampling time.

* * * * *